(12) United States Patent
Nakahara et al.

(10) Patent No.: US 6,184,970 B1
(45) Date of Patent: *Feb. 6, 2001

(54) MASTER PLATE TRANSPORTING SYSTEM

(75) Inventors: Kanefumi Nakahara; Yutaka Endo; Akio Nishikata, all of Yokohama (JP)

(73) Assignee: Nikon Corporation, Tokyo (JP)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/955,949

(22) Filed: Oct. 22, 1997

(30) Foreign Application Priority Data

Nov. 22, 1996 (JP) .................................................... 8-311518

(51) Int. Cl.[7] ............................. G03B 27/42; G03B 27/62

(52) U.S. Cl. ............................................. 355/53; 355/75

(58) Field of Search ............................... 355/47, 53, 67, 355/72, 77, 75, 133; 356/399, 400, 401; 430/5, 30; 250/548, 492.22; 414/225, 331, 321, 749

(56) References Cited

U.S. PATENT DOCUMENTS

| | | | |
|---|---|---|---|
| 4,265,440 | * 5/1981 | Shibazaki et al. | 271/9 |
| 4,776,462 | * 10/1988 | Kosugi et al. | 206/334 |
| 4,974,166 | 11/1990 | Maney et al. | 364/478 |
| 4,984,953 | * 1/1991 | Nakazato et al. | 414/331 |
| 4,999,671 | * 3/1991 | Iizuka | 355/97 |
| 5,097,421 | 3/1992 | Maney et al. | 364/478 |
| 5,126,946 | * 6/1992 | Ko | 364/469 |
| 5,380,138 | * 1/1995 | Kasai et al. | 414/277 |
| 5,414,974 | * 5/1995 | Van De Ven et al. | 53/399 |
| 5,442,163 | * 8/1995 | Nakahara et al. | 235/381 |
| 5,570,990 | 11/1996 | Bonora et al. | 414/543 |
| 5,671,057 | * 9/1997 | Kawai | 356/399 |
| 5,684,599 | * 11/1997 | Shimoyama et al. | 356/400 |
| 5,727,685 | * 3/1998 | Laganza et al. | 206/455 |
| 5,747,221 | * 5/1998 | Kim et al. | 430/311 |
| 5,785,309 | * 7/1998 | Halup et al. | 271/11 |
| 5,909,030 | * 6/1999 | Yoshitake et al. | 250/492.2 |

FOREIGN PATENT DOCUMENTS 4-340245   11/1992 (JP) .

OTHER PUBLICATIONS

Patent Abstract of Japan, vol. 096, No. 004, Apr. 30, 1996 and JP 07 321179 A (Nikon Corp.), Dec. 8, 1995.

"Photomasks with Integral Laser Mirrors and Calibration of Integral Laser Mirrors on Photomasks", IBM Technical Disclosure Bulletin, vol. 32, No. 5B, Oct. 1, 1989, pp. 19–21.

* cited by examiner

*Primary Examiner*—Russell Adams
*Assistant Examiner*—Henry Hung Nguyen
(74) *Attorney, Agent, or Firm*—Nixon & Vanderhye P.C.

(57) ABSTRACT

A master plate transporting system automatically detects the presence/absence of master plates accommodated in a container and also detects the position of each master plate in the container as well as the type of the container being used. In this arrangement, the master plate transporting system executes the automatic transporting operation without transport errors. Containers each holding one or more reticles, are positioned in a semiconductor manufacturing apparatus. A reticle detection sensor detects the presence and the position of the reticle in each container. A controller controls the transporting operation of a reticle transporting mechanism based on the detection results of the detection sensor to reliably retrieve the reticle, transport it to an exposure system, and return it to the container.

12 Claims, 4 Drawing Sheets

MASTER PLATE TRANSPORTING SYSTEM

BACKGROUND OF THE INVENTION

This invention relates to a transporting system and more particularly, to a transporting system for transporting an exposure master plate, such as a reticle or a photomask.

Using an exposure apparatus (e.g., a stepper), a circuit pattern formed on a reticle is exposed to light so as to transfer the image of the circuit pattern onto a wafer coated with a photoresist layer, thereby forming the circuit pattern on the wafer. In general, multiple layers of circuit patterns are superimposed on the wafer during exposure, and a plurality of different types of reticles having different patterns are successively used during the exposure process.

In order to interchange the multiple reticles promptly, several types of transporters that are capable of transporting master plates (e.g., reticles) in an efficient fashion have been proposed. For example, Japanese Patent Application Laid-Open No. 7-321179 and corresponding U.S. Patent Application Ser. No. 08/445,170 disclose such a transporter that retrieves a master plate from a container, carries the master plate from the container to the exposure stage, and returns the master plate into the container. The container is installed in an exposure apparatus to accommodate one or more master plates.

With this type of transporter, it must be confirmed in advance (i) that the master plates are actually stored in the container, and (ii) which master plate is stored at which position. To this end, the operator has to check that the master plates are in the container, the positions of the master plates, the type and the capacity of the container, and so on. In the automatic transporting mode, the operator generally specifies the positions of the master plates and gives directions for transporting the master plates.

In this context, the operator may make a mistake in his directions. For instance, if the operator mistakenly gives a direction to retrieve a master plate from an empty position, a transport error occurs because the transporter moves to the empty place to receive a nonexisting master plate. In such a case, the operation of the exposure apparatus and the production line stops. Conversely, if the operator issues directions to return the master plate to a position at which another master plate is stored, the two master plates strike each other, and the expensive master plates can be damaged.

Transport errors may also occur when a container is replaced with another container that stores different master plates in different positions. If the operator forgets to update the directions for the new container, a master plate that is being returned to an empty position in the former container may collide with another master plate that is stored in the same position in the other container. This then is another type of scenario in which the master plates can be damaged.

To eliminate transport errors caused by the operator, optical sensors for detecting whether a master plate is stored in each position of the container have been proposed. Reticles, however, which serve as the master plates, are made of a transparent material, such as quartz, and are made in the shape of a flat plate (referred to as a quartz glass plate). Because most of the light passes through this quartz reticle, it is difficult for a transmission-type optical sensor to determine its presence, i.e., the presence of a master plate.

Furthermore, several types of containers, including a single-plate container and a multiple-plate container, are used in an exposure apparatus. The automatic transporting mode cannot be successfully performed unless the type of container is identified. If a direction is made under the assumption of a multiple-plate container when a single-plate container is used then a transport error or a collision between two master plates may occur.

SUMMARY OF THE INVENTION

The present invention was conceived to overcome these problems and aims to provide a master plate transporting system that can automatically detect the presence/absence and the position, if present, of a master plate in a container and that can automatically determine the type of container.

In particular, the present invention aims to provide a master plate transporting system that is suitable for an exposure apparatus in which transparent master plates, such as reticles, are stored in a container. The present invention additionally aims to provide a master plate transporting system that can detect the presence and the position of transparent master plates in a reliable manner and transport the master plates accurately.

In order to achieve these and other objects, in one aspect of the invention, a master plate transporting system is designed to transport a master plate between a master plate container, which stores one or more master plates, and a processing system for executing prescribed processes using the master plate. The master plate transporting system has an edge detector for detecting the edge of the master plate stored in the container to determine if there is a master plate in the container. Because the presence/absence of the master plate is determined based on the edge detection, the transporting system is able to detect the presence of the master plates accurately even if a plurality of master plates are stacked in the container.

Preferably, the edge detector includes a light-emitting system for emitting light toward the container, a light-receiving system for receiving the light reflected from the edge of a master plate, and a determination unit that determines that master plates are stored in the container when the receiving system receives the reflected light. Because the edge of the master plate is used for optical detection, the presence of the master plate is reliably detected even if the master plate is a transparent glass plate, like a reticle used in an exposure apparatus.

If a plurality of master plates are stacked in the container, it is preferable for the master plate transporting system to have a position detector for detecting the vertical position of each master plate. In this arrangement, the presence and the position of the master plate are simultaneously detected.

The master plate transporting system further includes a controller for controlling the transporting action in response to the detection result of the edge detector.

In another aspect of the invention, a master plate transporting system is designed to transport a master plate between a master plate container and a processing system for executing prescribed processes using the master plate. The master plate container stores one or more master plates and is interchangeable with other master plate containers having different sizes depending on the number of master plates in them. The master plate transporting system also has a size detector for detecting the size of the master plate container in order to perform transport control according to the size of the container.

If the size difference between master plate containers is a difference in height, depending on the number of master plates stacked in the container, the size detector detects the size of the master plate container based on the height of the containers.

BRIEF DESCRIPTION OF THE DRAWINGS

The above and other objects, features, and advantages of the present invention will be described in the detailed description which follows, with reference to the drawings, wherein.

DETAILED DESCRIPTION OF PREFERRED EMBODIMENTS

Figure 1:
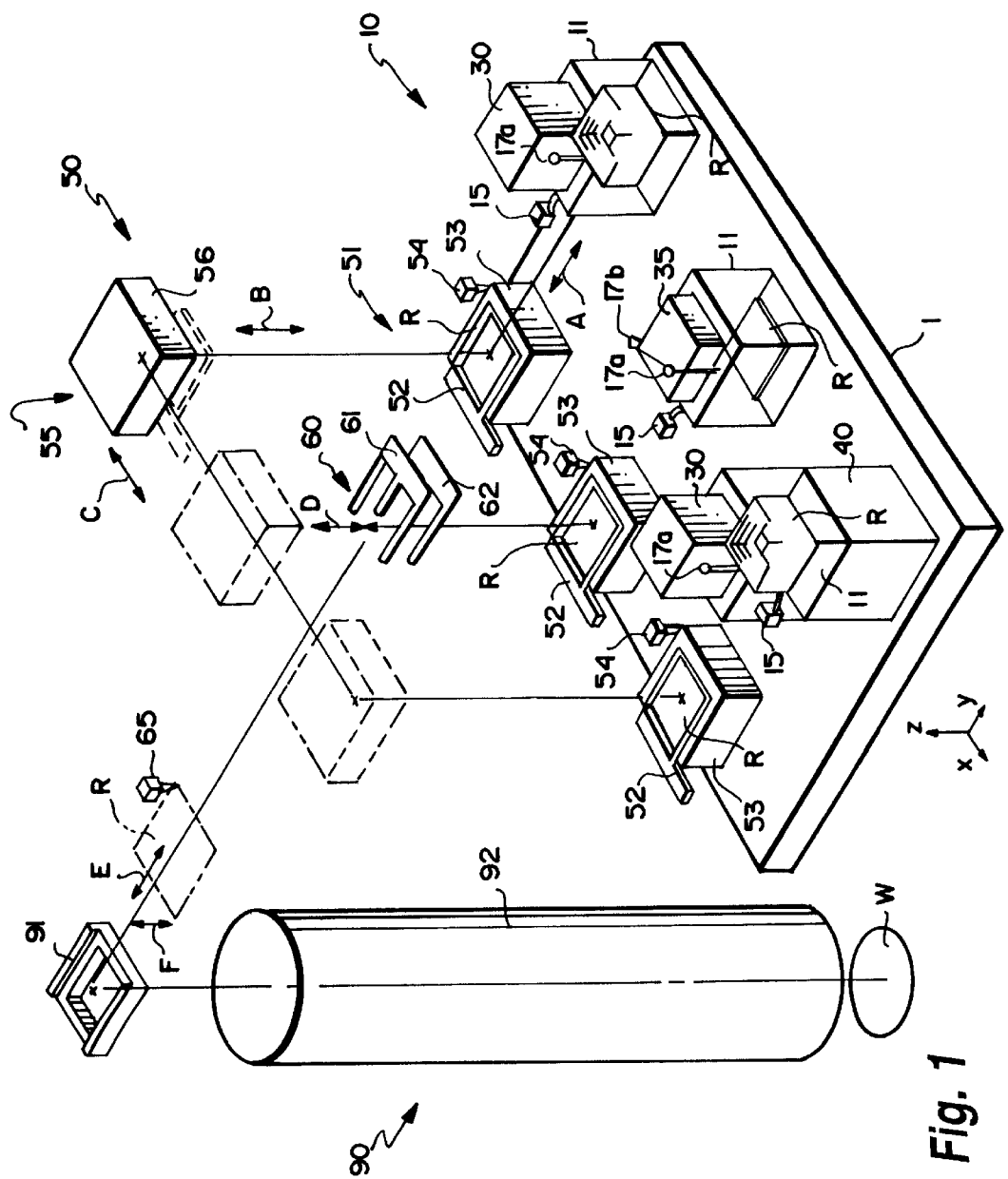
FIG. 1 is a perspective view showing the internal structure of an exposure apparatus having the master plate transporting system according to the invention.

A preferred embodiment of the invention will now be described with reference to the accompanying drawings. FIG. 1 illustrates the internal structure of an exposure apparatus (a so-called stepper) having the master plate transporting system according to the invention. The overall structure shown in FIG. 1 is enclosed in a chamber (not shown), in which a pure and clean atmosphere is maintained. In the figure, the arrows labelled X, Y and Z indicate the X, Y and Z directions.

In its basic structure, the exposure apparatus comprises a reticle storing system 10 that is positioned on a base 1, a reticle transporting system 50, and an exposure system 90 that is positioned on an anti-vibration stage (not shown).

Figure 5:
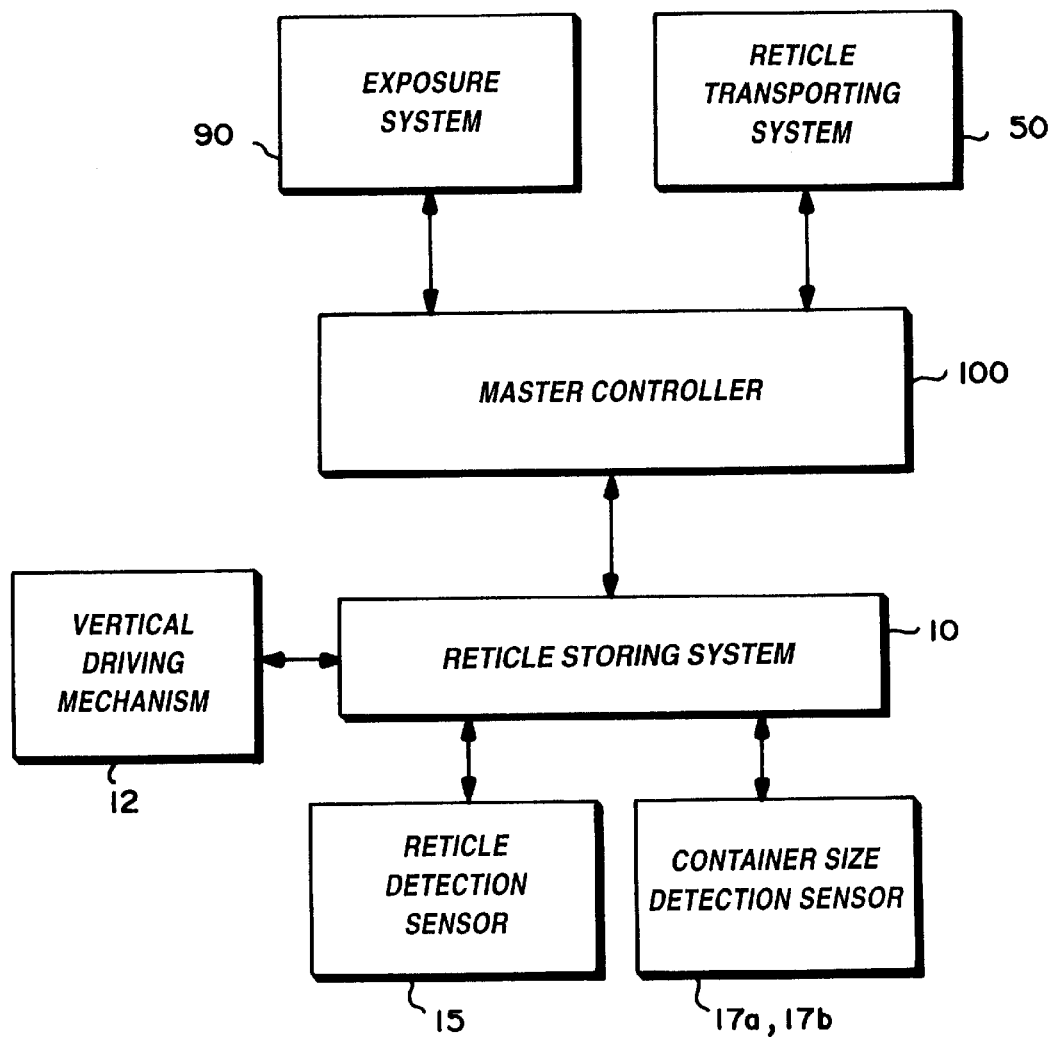
FIG. 5 is a block diagram of the control system of the exposure apparatus.

FIG. 5 is a block diagram of the exposure apparatus. The master controller 100 shown in this figure controls the entire operation of the exposure apparatus, and in particular, it controls the exposure system 90, the reticle transporting system 50, and the reticle storing system 10. The reticle storing system 10 supplies output signals that are generated from a vertical driving mechanism 12, a reticle detection sensor 15, and a container size detection sensor 17a, 17b to the master controller 100.

Returning to FIG. 1, the reticle storing system 10 comprises three separate storage units 11 that are positioned on the base 1 at prescribed intervals in the X direction, and containers 30, 35, each being attached to one of the storage units 11 in a detachable manner. Among the three separate storage units 11, the left storage unit 11 in the figure is positioned on a foreign body detector 40, which detects foreign bodies on the reticle R.

Each of the containers 30 and 35 stores one or more reticles R, which are made of transparent glass plates on which a prescribed pattern is formed. In this embodiment, two different kinds of containers are used, namely, the container 30, which preferably stores up to six reticles R, and the container 35, which stores a single reticle R. The containers 30 and 35 store the reticles R as is, without using a reticle case for sealing each reticle R. Each of the containers 30 and 35 is attachable to any of the separate storage units 11 in a detachable manner.

Figure 4:
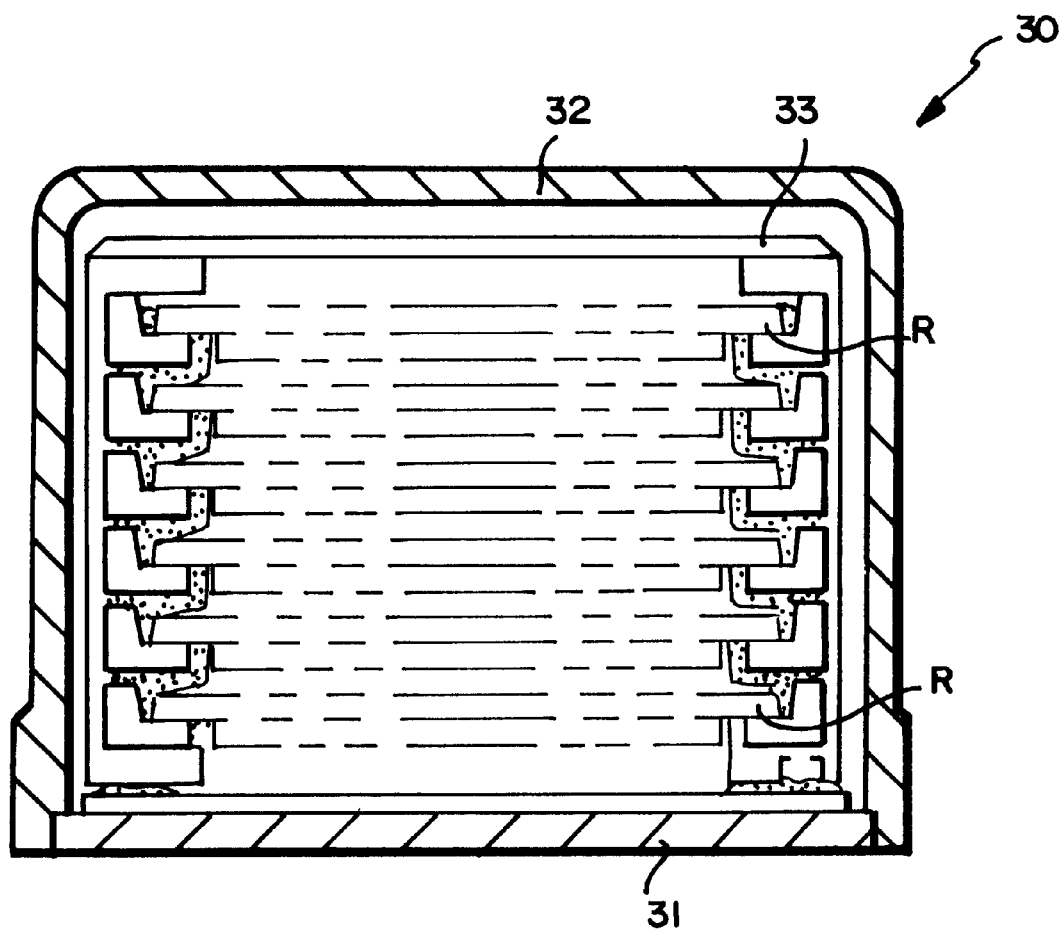
FIG. 4 is a front view of the master plate container for holding reticles.

FIG. 4 shows the structure of the multi-plate container 30. The container 30 has a base 31, a rack 33 that is positioned on the base 31, and a cover 32 that is attached to the base 31 so as to enclose the rack 33 in a detachable manner. The cover 32 is engaged with the base 31 through a lock mechanism (not shown). The rack 33 preferably has six shelves in which the reticles R are inserted, as shown in FIG. 4.

The single-plate container 35 has the same structure as the multi-plate container 30 except for the number of shelves of the rack 33. The container 35 has a single shelf and is capable of holding a single reticle R. Consequently, the height of the single-plate container 35 is less than that of the multi-plate container 30. Although, in this embodiment, one single-plate container 35 and two multi-plate containers 30 are used, containers storing any number of reticles may be used, as may be required for the process being performed. The height of the container would differ depending on the number of reticles it is designed to hold.

Figure 2:
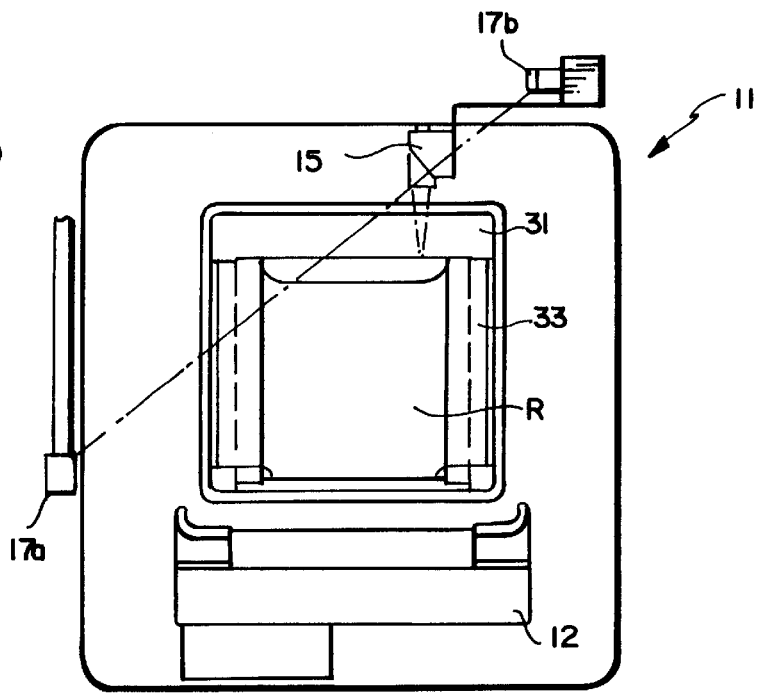
FIG. 2 is a plan view of the separate storage unit shown in FIG. 1.
Figure 3:
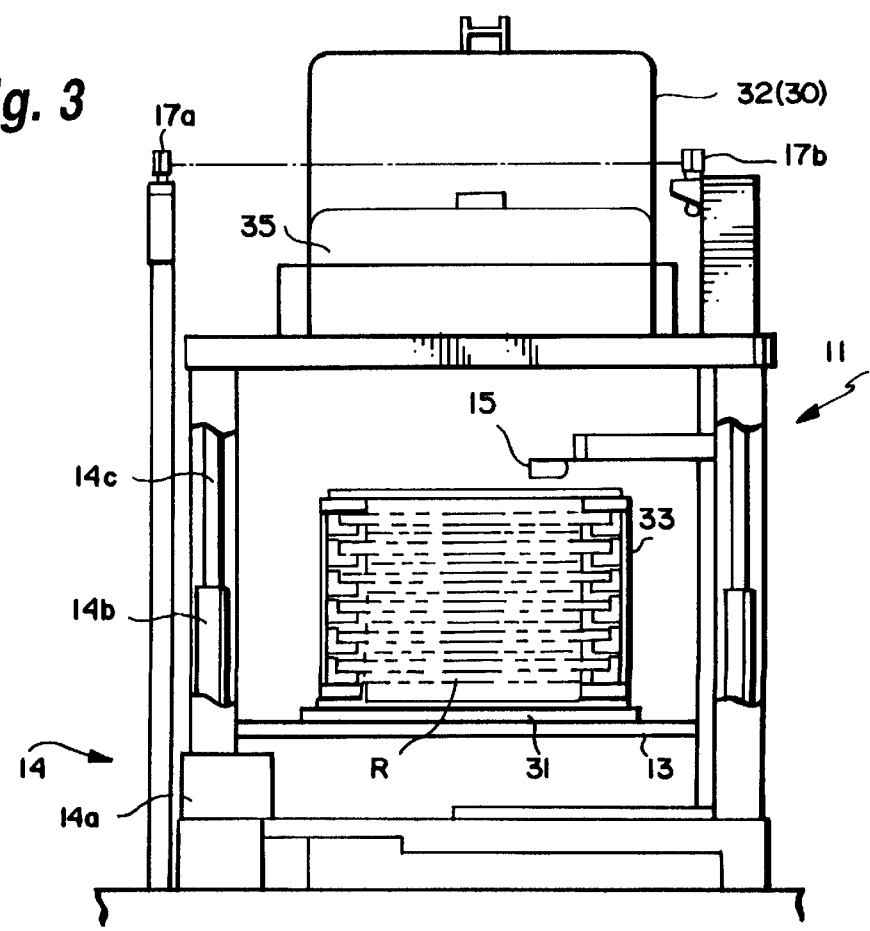
FIG. 3 is a rear view of the separate storage unit shown in FIG. 1.

Each of the separate storage units 11 has an opening on its top surface so as to receive the base 31 and the rack 33 of one of the containers 30 or 35. The attachment recess has a mechanism (not shown) for unlocking the lock between the base 31 and the cover 32. The vertical driving mechanism 12 is provided on the rear side of the storage unit 11 as shown in FIG. 2. Referring to FIG. 3, the vertical driving mechanism includes a support shelf 13 coupled with a motor assembly 14 including a motor 14a, a ball screw 14b and a linear guide 14c. When a container 30 or 35 is received by the support shelf 13 in the storage unit opening, the vertical driving mechanism 12 moves the unlocked base 31 and the rack 33 downward within the storage unit 11 via the motor assembly 14. The cover 32 remains at the top of the storage unit 11, supported by suitable supporting structure such as supporting rails as shown in FIG. 3, which delimit the storage unit opening.

The front side of the storage unit 11, in which the reticle detection sensor 15 is positioned, is open as shown in FIGS. 2 and 3. The reticle detection sensor 15 has a light-emitting system for emitting detection light toward the reticle R and a light-receiving system for receiving light reflected from the reticle R. In one arrangement as shown in FIG. 2, a reticle detection sensor 15 is used in which the light-emitting system is aligned with the light-receiving system. The controller 100 determines whether a reticle R is present in the storage unit 11 based on the signal received from the light-receiving system.

A 5-inch square reticle R has a thickness of, for example, about 3 mm, and a 6-inch square reticle R has a thickness of, for example, about 6 mm. Taking advantage of this thickness, the light-emitting system emits detection light toward the edge of the reticle R either in a straight direction in the case of the aligned structure noted above or obliquely in the case of structure wherein the light-emitting system and the light-receiving system are disposed side-to-side, and the light-receiving system receives the light reflected from the edge of the reticle R.

The reticle detection sensor 15 is positioned facing the rack 33 when the rack 33 is moved into the storage unit 11 by the vertical driving mechanism 12. Detection light is emitted to the location where the front edge of a reticle R inserted in the rack 33 would be if it were present, to detect if there is indeed a reticle R in the rack 33.

Because the reticle R is made of transparent material, such as quartz glass, and because it transmits light, it is difficult for a transmission-type sensor to detect the presence of the reticle R. In this embodiment, however, a reflection-type sensor is used to detect light reflected from the edge of the reticle R, thereby reliably detecting the presence of the transparent reticle R. The reticle detection sensor 15 is positioned at about the midpoint of the vertical path of the rack 33. When the rack 33 completely descends (to the position shown in FIG. 3), the reticle detection sensor 15 is positioned higher than the rack 33, and therefore, the front side of the rack 33 is open.

The controller 100 determines which shelves of the rack 33 are occupied by the reticles R and which shelves are empty based on the position signal received from the vertical driving mechanism 12 and the output signal received from the reticle detection sensor 15.

Although, in this embodiment, a single detection sensor 15 is provided for a plurality of containers 30 and 35, two or more detection sensors 15 may be provided along the vertical path of the rack 33. In this case, the output signals from the plurality of detection sensors are sufficient to determine which shelves are occupied by reticles and which are not. The reticle detection sensors 15 may be made movable so that they can recede so as not to disturb the motion of the reticle transporting arm 52 when the reticle transporting arm 52 comes into the rack 33.

A container size detection sensor, which consists of a light-emitting unit 17a and a light-receiving unit 17b, is also provided at the top of the storage unit 11. The container size detection sensor is a transmission-type sensor, in which the light-emitting unit 17a emits light directly toward the light-receiving unit 17b. The size of the container is determined based on whether the light-receiving unit 17b receives the light emitted from the light-emitting unit 17a. The light-emitting unit 17a and the light-receiving unit 17b are positioned at the same height on two adjacent sides of the attachment recess, so that the optical path between the light-emitting unit 17a and the light-receiving unit 17b is blocked when the multi-plate container 30 is attached into the attachment recess, but is not blocked when the single-plate container 35 is attached. The controller detects that the multi-plate container 30 is attached when there is no signal from the light-receiving unit 17b and that the single-plate container 35 is attached when there is a signal from the light-receiving unit 17b.

Since only two types of containers 30 and 35 are used in this embodiment, a single sensor set (i.e., light-emitting unit 17a and light-receiving unit 17b) is used. When three or more types of containers are used, however, the number of sensor sets may be increased according to the number of different heights of the containers. Alternatively, an optical sensor that has a continuous detection range in the vertical direction may be used. Also, a reflection-type sensor may be used in place of the transmission-type sensor to detect the size of the container.

The reticle transporting system 50 comprises a first transporting mechanism 51, which has a reticle transporting arm 52, a second transporting mechanism 55, which has a reticle transporting unit 56, and a third transporting mechanism 60, which has a loading arm 61 and an unloading arm 62 that are vertically aligned.

In this embodiment, three first transporting mechanisms 51 are provided in the transporting system corresponding to the number of separate storage units 11. Each of the first transporting mechanisms 51 has a reticle transporting arm 52 and a first driving mechanism for driving the transporting arm 52 in the Y direction (shown by arrow A in FIG. 1) and the Z direction (shown by arrow B in FIG. 1). In the path of the reticle transporting arm 52, a reticle position correcting unit 53 and a first bar-code reader 54 for reading a bar-code formed on the reticle R are provided.

The second transporting mechanism 55 has a second driving mechanism for moving the reticle transporting unit 56 in the X direction (shown by arrow C in FIG. 1) in the upper space within the chamber. The reticle transporting unit 56 has a vacuum adsorption mechanism whereby it holds the reticle R through vacuum adsorption.

The third transporting mechanism 60 has a third driving mechanism, which moves the loading arm 61 and the unloading arm 62 independently in the Z direction as indicated by arrow D, in the Y direction as indicated by arrow E, and in the Z direction as indicated by arrow F. In the path of the loading arm 61 and the unloading arm 62, a second bar-code reader 65 for reading the bar-code of the reticle R carried along this path is provided.

The exposure system 90 has an illumination system (not shown), a reticle stage 91, a projection-lens system 92, and a wafer stage for mounting a wafer W. A reticle R, which has been positioned on the reticle stage 91, is illuminated by the illumination system, and the pattern of the reticle R is projected with a reduced magnification onto a prescribed position of the wafer W by the projection-lens system 92. Since the operation of the exposure system 90 is not directly related to the present invention, the explanation for it is omitted.

The operation of the exposure apparatus having the structure described above will be explained. For each of the containers 30 and 35, a prescribed number of reticles R are inserted into the rack 33, and the base 31 and the cover 32 are locked. At this point, the operator places the containers 30 and 35 into the opening of the separate storage units 11 on the support shelves 13 of the vertical driving mechanisms 12, respectively. It is preferable to provide a sensor or a switch so as to detect the fact that the container has been attached to the storage unit 11. Up to this step, work performed in the chamber is performed manually by the operator. When the chamber door is tightly shut, the operator issues commands, and the controller 100 executes automatic transporting and exposure processes based on the commands.

When a start command is issued through the switching operation by the operator, the controller 100 causes the size detection sensors 17a and 17b to detect the size of the container attached to the storage unit 11 and then determines which type of container, the single-plate container 35 or the multi-plate container 30, is being used.

Next, the operator designates the position of a reticle R (i.e., the position of a shelf of the rack 33), and issues a command to transport this reticle R to the exposure position. In response to this command, the controller 100 unlocks the base 31 and the cover 32 and controls the vertical driving mechanism 12 to support the base 31 and the rack 33 and to lower them into the storage unit 11.

While the vertical driving mechanism 12 lowers the rack 33, the controller 100 causes the reticle detection sensor 15 to check for the presence of the reticle R. The controller 100 receives the output from the detection sensor 15 and, at the same time, receives the output from the vertical driving mechanism 12, which indicates the vertical position of the rack 33. With this information, the controller 100 determines which shelves of the rack 33 are occupied by reticles R and which are not. If the controller 100 determines that there is not a reticle in the shelf designated by the operator, it stops the operation, displaying on the monitor (not shown) the fact that no reticle R exists in that shelf, and waits for the operator's instruction.

If the controller 100 determines that there is a reticle R in the designated shelf, it continues the operation. When the base 31 and the rack 33 are completely lowered by the vertical driving mechanism 12, as shown in FIG. 3, the front of the rack 33 is open and faces one of the first transporting mechanisms 51. At this time, the transporting arm 52 moves forward into the designated shelf by means of the first driving mechanism and retrieves the reticle R. Then, the transporting arm 52, which is holding the reticle R, recedes until it is positioned above the reticle position correcting unit 53.

During this step, the bar-code of the reticle R is read by the first bar-code reader 54 to confirm and register the type of reticle that is being carried. The reticle position correcting unit 53 is a unit for correcting the position of the reticle R held by the transporting arm 52, and it performs pre-alignment of the reticle position with respect to the transporting arm 52 in a known manner.

After the pre-alignment has been performed, the transporting arm 52, which is holding the pre-aligned reticle R, moves in the direction indicated in FIG. 1 by arrow B toward the reticle transporting unit 56. The reticle transporting unit 56 comprises the second transporting mechanism 55. The reticle transporting unit 56 receives the reticle R from the transporting arm 52 and holds the reticle R via the vacuum adsorption mechanism.

In the second transporting mechanism 55, the reticle transporting unit 56 moves in the upper portion of the chamber in the X direction indicated in FIG. 1 by arrow C to a predetermined middle position of the chamber. At the same time, the loading arm 61 and the unloading arm 62 of the third transporting mechanism 60 move to a position such that the loading arm 61 and the unloading arm 62 are vertically aligned with the reticle transporting unit 56, which has reached the predetermined middle position of the chamber.

Then, the loading arm 61 is moved upward by the third driving mechanism toward the reticle transporting unit 56 to retrieve the reticle R from the reticle transporting unit 56. The reticle transporting unit 56 has a mechanism for pre-aligning the reticle R with the correct loading position in a known manner, and accordingly, a properly aligned state is maintained.

When the reticle R is mounted on the loading arm 61, the loading arm 61 moves along the paths indicated in FIG. 1 by arrows D, E, and F, successively, to transport the reticle R onto the reticle stage 91 of the exposure system 90. During this step, the bar-code of the reticle R is read by the second bar-code reader 65 to confirm whether the correct reticle is being carried. Pre-alignment of the reticle R ensures that the reticle R passes in front of the second bar-code reader 65, and the bar-code is read reliably.

After the reticle R is mounted on the reticle stage 91, the loading arm 61 recedes. The reticle R is accurately aligned on the reticle stage 91 with respect to the wafer W. Exposure light is emitted by the illumination system (not shown) to illuminate the reticle R, and the image of the pattern formed on the reticle R is projected while being reduced by the projection lens system 92 onto a prescribed position on the wafer W.

When the exposure has been completed, the unloading arm 62 approaches the reticle stage 91 to receive the reticle R from the reticle stage 91. The unloading arm 62 traces the return path, which is the opposite of the path of the loading arm 61, and passes the reticle R to the reticle transporting unit 56. The reticle R is further passed from the transporting unit 56 to the reticle transporting arm 52.

At this time, the operator designates the shelf of the rack 33 in the container to which the reticle R is to be returned. In response to this instruction, the reticle transporting arm 52 carries the reticle to the designated shelf. If the operator designates a wrong shelf by mistake, for example, a shelf that is occupied by another reticle R, the reticle detection sensor 15 automatically detects the presence of the other reticle R, displays the fact of the non-availability of the designated shelf on the monitor screen (not shown), and waits for a correct instruction. In this manner, collision of reticles can be prevented, avoiding damage to the expensive reticles.

The transporting system according to the invention includes a plurality of containers and a corresponding number of first transporting mechanisms 51, so that multiple different types of master plates can be placed in advance in the exposure apparatus, which is used, for example, for manufacturing semiconductor devices. This arrangement eliminates the necessity of changing containers during the manufacturing process, thereby promoting automation and reducing operator workload.

Furthermore, in this embodiment, a foreign-body detector 40 is provided below the left storage unit 11. Any foreign bodies, such as dust, attached on the surface of the reticle can be detected and removed in a known manner before the reticle is placed in the reticle stage 91. More specifically, the reticle taken out of the storage unit 11 is carried by the reticle transporting arm 52 and passes through the foreign-body detector 40 on the way to the reticle stage 91 while being transported by the first transporting mechanism 51. In this way, the productivity and the quality of the resultant device are improved. A foreign-body detector 40 may be provided for each of the storage units 11.

As has been described, the master plate transporting system of the invention has an edge detector that determines the presence of master plates in the container by detecting the edges of any master plates stored in the container. Even if multiple master plates are inserted in the container, the presence of the master plates are reliably detected and consequently, transporting of the master plates can be carried out smoothly.

The edge detector has a detection unit consisting of a light-emitting system and a light-receiving system, which determines that there is a master plate in the container when the light-receiving system actually receives reflected light. Because the edge of the master plate is used for this reflection, the presence of the master plate is reliably detected even if a transparent glass plate, such as a reticle for an exposure apparatus, is used.

The master plate transporting system also has a position detector for detecting the vertical position of each master plate. The position detector is useful if a plurality of master plates are stacked in the container. In this arrangement, the presence and the position of the master plates are simultaneously detected.

The master plate transporting system further has a controller for controlling the transporting action in response to the detection result of the edge detector.

According to the invention, different sizes of containers, i.e., containers holding a different number of reticles, can be used in the exposure apparatus. Because the master plate transporting system has a size detector, it is capable of controlling the transporting operation according to the size of the container.

While the invention has been described by way of exemplary embodiments, it is understood that many changes and substitutions may be made by those skilled in the art without departing from the spirit and the scope of the invention, which is defined by the appended claims.

What is claimed is:

1. An exposure apparatus for exposing an image pattern formed on a reticle onto an object, the exposure apparatus comprising:

an exposure system located between the reticle and the object to expose the image pattern onto the object;

a reticle storing system including an upper unit, a lower unit and a moving unit to store one or more reticles, said moving unit moving said one or more reticles between said upper unit and said lower unit;

a reticle transporting system cooperating with the reticle storing system, the reticle transporting system transporting the reticle between the reticle storing system and the exposure system; and an edge detector disposed facing a location where an edge of the reticle should be if present, the edge detector being positioned to detect the edge of the reticle in a non-contact manner while said moving unit moves said one or more reticles between said upper unit and said lower unit.

2. The exposure apparatus according to claim 1, further comprising a controller communicating with the edge detector, the controller controlling the transporting according to a detection result of the edge detector.

3. The exposure apparatus according to claim 1, wherein the edge detector comprises:

a light-emitting system that emits a light to the edge of the reticle;

a light-receiving system that receives the light reflected from the edge of the reticle; and a detection unit communicating with the light-receiving system, the detection unit detecting the presence of the reticle in the reticle storing system in accordance with a signal from the light receiving system.

4. The exposure apparatus according to claim 1, wherein the edge detector is a reflection-type sensor.

5. An object on which said image pattern has been transferred by the exposure apparatus according to claim 1.

6. The exposure apparatus according to claim 1, wherein said moving unit comprises a holding surface that holds said one or more reticles, and wherein said edge detector is substantially perpendicular to the holding surface.

7. The exposure apparatus according to claim 1, wherein said upper unit is detachable from said lower unit.

8. A method for making an exposure apparatus that exposes a pattern of a reticle onto an object, the method comprising:

providing an exposure system that exposes the pattern onto the object;

providing a reticle storing system including an upper unit, a lower unit and a moving unit to store one or more reticles, said moving unit moving said one or more reticles between said upper unit and said lower unit;

providing a reticle transporting system cooperating with the reticle storing system, the reticle transporting system transporting the reticle between the reticle storing system and the exposure system; and providing an edge detector disposed facing a location where an edge of the reticle should be if present, the edge detector detecting a side surface of the reticle in a non-contact manner while said moving unit moves said one or more reticles between said upper unit and said lower unit.

9. The method according to claim 8, further comprising providing a controller that communicates with the edge detector, the controller controlling the reticle transporting system according to a detection result of the edge detector.

10. The method according to claim 8, wherein the edge detector is a reflection-type sensor.

11. The method according to claim 8, wherein said moving unit comprises a holding surface that holds said one or more reticles, and wherein said edge detector is substantially perpendicular to the holding surface.

12. The method according to claim 8, wherein said upper unit is detachable from said lower unit.

\* \* \* \* \*